United States Patent
Ishida et al.

(10) Patent No.: US 6,420,197 B1
(45) Date of Patent: Jul. 16, 2002

(54) SEMICONDUCTOR DEVICE AND METHOD OF FABRICATING THE SAME

(75) Inventors: Masahiro Ishida; Masaaki Yuri; Osamu Imafuji; Shinji Nakamura; Kenji Orita, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/511,371

(22) Filed: Feb. 23, 2000

(30) Foreign Application Priority Data

Feb. 26, 1999 (JP) .......................... 11-050027

(51) Int. Cl.$^7$ .............................................. H01L 21/00
(52) U.S. Cl. ....................... 438/22; 438/20; 438/22; 438/47; 257/9; 257/10; 257/11; 257/13; 257/21; 372/7; 372/43; 372/44; 372/45
(58) Field of Search .................. 438/22–47, 18–20; 257/9–13, 21; 148/DIG. 96; 372/7, 43–46

(56) References Cited

U.S. PATENT DOCUMENTS

| | | | | |
|---|---|---|---|---|
| 4,922,105 A | * | 5/1990 | Hosoi | 250/484.1 |
| 5,432,808 A | * | 7/1995 | Hatano et al. | 372/45 |
| 5,488,233 A | * | 1/1996 | Ishikawa et al. | 257/94 |
| 5,592,501 A | * | 1/1997 | Edmond et al. | 372/45 |
| 5,760,426 A | * | 6/1998 | Marx et al. | 257/190 |
| 5,777,350 A | | 7/1998 | Nakamura | |
| 5,838,706 A | * | 11/1998 | Edmond et al. | 372/45 |
| 5,874,747 A | * | 2/1999 | Redwing et al. | 257/77 |
| 6,045,626 A | * | 4/2000 | Yano et al. | 148/33.4 |
| 6,072,197 A | * | 6/2000 | Horino et al. | 257/103 |
| 6,087,681 A | * | 7/2000 | Shakuda | 257/103 |
| 6,111,277 A | * | 8/2000 | Ikeda | 257/99 |
| 6,219,364 B1 | * | 4/2001 | Dei | 372/36 |
| 6,242,764 B1 | * | 6/2001 | Ohba et al. | 257/190 |

FOREIGN PATENT DOCUMENTS

| | | | | |
|---|---|---|---|---|
| EP | 1032-099 A2 | * | 8/2000 | ........... H01S/5/323 |
| JP | 6-177423 | | 6/1994 | |
| JP | 6-326416 | | 11/1994 | |
| JP | 7-165498 | | 6/1995 | |
| JP | 12-223659 | * | 8/2000 | ........... H01L/27/00 |

OTHER PUBLICATIONS

M. Khan et al. "Quaternary AllnGaN based vertically conducting emitting diodes on SiC" Device research conference, 2000. Conference digest 58$^{th}$ DRC 2000 pp. 123–124.*

J. Piprek et al. "Energy gap bowing and reflective index spectrum of AllnN and AlGaInN" Ieee 1998 0–7803–3883 pp. 227–230.*

Hyunsoo Kim et al. "Reliability and Modeling of GAN–based Light emitting diode" Device research conference 2000 Conference Digest 58th DRC 2000 pp. 73–74.*

A. Watanabe et al., "The growth of single crystalline GaN on a Si substrate using A1N as an intermediate layer", Journal of Crystal Growth, Elsevier Science Publishers B.V., 1993, pp. 391–396.

* cited by examiner

Primary Examiner—Matthew Smith
Assistant Examiner—Granvill D Lee, Jr.
(74) Attorney, Agent, or Firm—Eric J. Robinson; Nixon Peabody LLP

(57) ABSTRACT

A semiconductor device comprises a substrate having a first thermal expansion coefficient T1, a strain reducing layer formed on the substrate and having a second thermal expansion coefficient T2, and a semiconductor layer formed on the strain reducing layer, having a third thermal expansion coefficient T3, and made of a nitride compound represented by $Al_yGa_{1-y-z}In_zN$ ($0 \leq y \leq 1$, $0 \leq z \leq 1$). The second thermal expansion coefficient T2 is lower than the first thermal expansion coefficient T1. The third thermal expansion coefficient T3 is lower than the first thermal expansion coefficient T1 and higher than the second thermal expansion coefficient T2.

13 Claims, 8 Drawing Sheets

SEMICONDUCTOR DEVICE AND METHOD OF FABRICATING THE SAME

BACKGROUND OF THE INVENTION

The present invention relates to a semiconductor device comprising a nitride compound semiconductor layer and a method of fabricating the same.

A nitride compound semiconductor such as GaN, InN, or AlN is a material suitable for use in a blue semiconductor laser device or in a transistor operable at a high speed even at a high temperature.

There has conventionally been known a technique for the crystal growth of a nitride compound semiconductor on a Si (silicon) substrate (A. Watanabe et al., Journal of Crystal Growth volume 128 (1993) pp. 391–396).

As a first conventional embodiment, a laser diode comprising a nitride compound semiconductor layer formed on a silicon substrate will be described with reference to FIG. 6.

As shown in FIG. 6, an AlN layer 11 as a buffer layer, a GaN layer 12 as a first contact layer, a first clad layer 13 made of n-type AlGaN, an active layer 14 made of undoped GaInN, a second clad layer 15 made of p-type AlGaN, and a second contact layer 16 made of p-type GaN are stacked successively in layers on a silicon substrate 10. The AlN layer 11 is formed by growing an AlN crystal on the silicon substrate 10. The GaN layer 12 is formed by growing a GaN crystal on the AlN layer 11 at a temperature of 1050° C. and doped with an impurity such as Si, Ge, or Se to have the n-type conductivity. To form the GaN layer 12, metal organic vapor phase epitaxial growth (hereinafter referred to as MOVPE) is used.

A p-type electrode 18 made of an Ni—Au alloy on the second contact layer 16 with a current restricting layer 17 having an opening of 17a interposed therebetween, while an n-type electrode 19 is formed on a back surface of the silicon substrate 10.

In the first conventional embodiment, a tensile strain is applied from the silicon substrate 10 to the GaN layer 12 and an internal stress is produced in the GaN layer 12 in response to the tensile strain when the temperature of the silicon substrate 10 is lowered from the crystal growth temperature of 1050° C. to a room temperature after the formation of the GaN layer 12. This is because the thermal expansion coefficient ($2.55\times10^{-6}$/K) of Si is lower than the thermal expansion coefficient ($5.59\times10^{-6}$/K) of GaN. The internal stress produced in the GaN layer 12 increases disadvantageously to form a crack (crevice) in the GaN layer 12. Thus, the method for the crystal growth of a nitride compound semiconductor on a silicon substrate is not practical.

Therefore, a technique for the crystal growth of a nitride compound semiconductor on a sapphire substrate has been used instead (U.S. Pat. No. 5,777,350).

As a second conventional embodiment, a laser diode comprising a nitride compound semiconductor layer formed on a sapphire substrate will be described with reference to FIG. 7.

As shown in FIG. 7, an AlN layer 21 as a buffer layer, a GaN layer 22 as a first contact layer, a first clad layer 23 made of n-type AlGaN, an active layer 24 made of undoped GaInN, a second clad layer 25 made of p-type AlGaN, and a second contact layer 26 made of p-type GaN are stacked successively in layers on a sapphire substrate 20. The AlN layer 21 is formed by growing an AlN crystal on the sapphire substrate 20. The GaN layer 22 is formed by growing a GaN crystal on the AlN layer 21 by using MOVPE at a temperature of 1050° C. The GaN layer 22 is doped with an impurity such as Si, Ge, or Se to have the n-type conductivity. It is to be noted that a device structure composed of the GaN layer 22 as the first contact layer, the first clad layer 23, the active layer 24, the second clad layer 25, and the second contact layer 26 has been partially removed by dry etching till the GaN layer 22 is etched halfway.

A p-type electrode 28 made of an Ni—Au alloy is formed on the second contact layer 26 with a current restricting layer 27 having an opening 27a interposed therebetween, while an n-type electrode 29 made of an Ni—Au alloy is formed in a space corresponding to the etched portion of the GaN layer 22, i.e., the first contact layer.

According to the second conventional embodiment, a crack is less likely to occur in the GaN layer 22 than in the first conventional embodiment since the difference between the thermal expansion coefficient ($7.5\times10^{-6}$/K) of sapphire ($Al_2O_3$) and the thermal expansion coefficient of GaN is smaller than the difference between the thermal expansion coefficient of Si and that of GaN.

In the second conventional embodiment, however, a compression strain is applied from the sapphire substrate 20 to the GaN layer 22 and an internal stress is produced in the GaN layer 22 in response to the compression strain when the temperature of the sapphire substrate 20 is lowered from the crystal growth temperature of 1050° C. to a room temperature after the formation of the GaN layer 22, since the thermal expansion coefficient of sapphire is higher than that of GaN. This prevents an improvement in the crystalline characteristics of the GaN layer 22 and causes the first problem that it is difficult to reduce an operating current for the laser diode.

The second conventional embodiment also presents the second problem that it is difficult to fabricate a laser diode having a smooth reflecting mirror surface since it is difficult to cleave the sapphire substrate 20.

To solve the second problem, there has been proposed a technique for forming a semiconductor substrate composed of a thick-film nitride compound semiconductor layer which has been formed by the crystal growth of a nitride compound semiconductor on a sapphire substrate and separated therefrom (Japanese Unexamined Patent Publication No. HEI 7-165498).

As a third conventional embodiment, a method of forming a laser diode by using a semiconductor substrate composed of a nitride compound semiconductor layer will be described with reference to FIGS. 8(a) to (d).

First, as shown in FIG. 8(a), an AlN layer 31 as a buffer layer is formed by growing an AlN crystal on a sapphire substrate 30.

Next, as shown in FIG. 8(b), a GaN layer 32 as a compound semiconductor layer is formed by growing a GaN crystal on the AlN layer 31 at a temperature of 1050° C.

Next, as shown in FIG. 8(c), the AlN layer 31 and the GaN layer 32 are separated from the sapphire substrate 30 by removing the sapphire substrate 30 by polishing, whereby a semiconductor substrate 33 composed of the AlN layer 31 and the GaN layer 32 is formed.

Next, as shown in FIG. 8(d), a first contact layer 34 made of n-type GaN, a first clad layer 35 made of n-type AlGaN, an active layer 36 made of undoped GaInN, a second clad layer 37 made of p-type AlGaN, and a second contact layer 38 made of p-type GaN are formed successively on the semiconductor substrate 33. Thereafter, a p-type electrode is formed on the second contact layer 38 with a current restricting layer interposed therebetween and an n-type electrode is formed on a back surface of the semiconductor substrate 33, though they are not depicted, whereby the laser diode is completed. According to the third conventional embodiment, a laser diode having a smooth reflecting mirror surface can be fabricated since the semiconductor substrate 33 is cleaved easily.

However, the third conventional embodiment has the problem that the crystalline characteristics of the GaN layer 32 composing the semiconductor substrate 33 cannot be improved due to the difference between the thermal expansion coefficient of sapphire and that of GaN, similarly to the second conventional embodiment. The third conventional embodiment also has the problem that the crystalline characteristics of the GaN layer are further degraded as the thickness of the GaN layer 32, i.e., the thickness of the semiconductor substrate 33 is increased.

SUMMARY OF THE INVENTION

In view of the foregoing, it is therefore an object of the present invention to improve the crystalline characteristics of a nitride compound semiconductor layer composing a semiconductor device.

To attain the object, a first semiconductor device according to the present invention comprises: a substrate having a first thermal expansion coefficient $T1$; a strain reducing layer having a second thermal expansion coefficient $T2$, the strain reducing layer being formed on the substrate; and a semiconductor layer having a third thermal expansion coefficient $T3$, the semiconductor layer being formed on the strain reducing layer and made of a nitride compound represented by $Al_yGa_{1-y-z}In_zN$ ($0 \leq y \leq 1$, $0 \leq z \leq 1$), the second thermal expansion coefficient $T2$ being lower than the first thermal expansion coefficient $T1$, the third thermal expansion coefficient $T3$ being lower than the first thermal expansion coefficient $T1$ and higher than the second thermal expansion coefficient $T2$.

In the first semiconductor device, the strain reducing layer having the second thermal expansion coefficient $T2$ lower than the first thermal expansion coefficient $T1$ is formed on the substrate having the first thermal expansion coefficient $T1$ and the nitride compound semiconductor layer having the third thermal expansion coefficient $T3$ lower than the first thermal expansion coefficient $T1$ and higher than the second thermal expansion coefficient $T2$ is formed on the strain reducing layer. Accordingly, when the temperature of the substrate is lowered from a temperature for the crystal growth of the nitride compound semiconductor layer to a room temperature after the formation of the nitride compound semiconductor layer, a compression strain applied from the substrate to the strain reducing layer and a tensile strain applied from the strain reducing layer to the nitride compound semiconductor layer cancel out each other. In other words, since the nitride compound semiconductor layer having the third thermal expansion coefficient $T3$ is formed on a multilayer structure composed of the substrate having the first thermal expansion coefficient $T1$ higher than the third thermal expansion coefficient $T3$ and the strain reducing layer having the second thermal expansion coefficient $T2$ lower than the third thermal expansion coefficient $T3$, the difference between a mean value of the thermal expansion coefficients of the multilayer structure and the third thermal expansion coefficient $T3$ can be made smaller than the difference between the first and third thermal expansion coefficients $T1$ and $T3$. As a result, an internal stress produced in the nitride compound semiconductor layer in response to the compression strain from the substrate is reduced and cracks are less likely to be formed in the nitride semiconductor layer, so that the crystalline characteristics of the nitride compound semiconductor layer are improved.

In the first semiconductor device, a ratio $T1/T3$ of the first thermal expansion coefficient $T1$ to the third thermal expansion coefficient $T3$ is preferably lower than a ratio $T3/T2$ of the third thermal expansion coefficient $T3$ to the second thermal expansion coefficient $T2$ and the substrate is preferably larger in thickness than the strain reducing layer.

The arrangement further reduces the difference between the mean value of the thermal expansion coefficients of the multilayer structure composed of the substrate and the strain reducing layer and the third thermal expansion coefficient $T3$, so that the crystalline characteristics of the nitride compound semiconductor layer are further improved.

In the first semiconductor device, a ratio $T1/T3$ of the first thermal expansion coefficient $T1$ to the third thermal expansion coefficient $T3$ is preferably higher than a ratio $T3/T2$ of the third thermal expansion coefficient $T3$ to the second thermal expansion coefficient $T2$ and the substrate is preferably smaller in thickness than the strain reducing layer.

The arrangement further reduces the difference between the mean value of the thermal expansion coefficients of the multilayer structure composed of the substrate and the strain reducing layer and the third thermal expansion coefficient $T3$, so that the crystalline characteristics of the nitride compound semiconductor layer are further improved.

In the first semiconductor device, the substrate is preferably made of sapphire and the strain reducing layer is preferably made of silicon.

In the arrangement, the strain reducing layer having a specified growth interface is formed on the substrate, so that the crystalline characteristics of the nitride compound semiconductor layer formed on the strain reducing layer are further improved.

In this case, the substrate preferably has a main surface having a (0001) plane and the strain reducing layer preferably has a growth interface having a (111) plane.

In the arrangement, the nitride compound semiconductor layer having a growth interface having a (0001) plane is formed on the strain reducing layer formed to have a growth interface having a (111) plane, so that the crystalline characteristics of the nitride compound semiconductor layer are further improved.

A second semiconductor device according to the present invention comprises: a substrate having a first thermal expansion coefficient $T1$; a strain reducing layer having a second thermal expansion coefficient $T2$, the strain reducing layer being formed on the substrate; and a semiconductor layer having a third thermal expansion coefficient $T3$, the semiconductor layer being formed on the strain reducing layer and made of a nitride compound represented by $Al_yGa_{1-y-z}In_zN$ ($0 \leq y \leq 1$, $0 \leq z \leq 1$), the second thermal expansion coefficient $T2$ being higher than the first thermal expansion coefficient $T1$, the third thermal expansion coefficient $T3$ being higher than the first thermal expansion coefficient $T1$ and lower than the second thermal expansion coefficient $T2$.

In the second semiconductor device, the strain reducing layer having the second thermal expansion coefficient $T2$ higher than the first thermal expansion coefficient $T1$ is formed on the substrate having the first thermal expansion coefficient T1 and the nitride compound semiconductor layer having the third thermal expansion coefficient T3 higher than the first thermal expansion coefficient T1 and lower than the second thermal expansion coefficient T2 is formed on the strain reducing layer. Accordingly, when the temperature of the substrate is lowered from a temperature for the crystal growth of the nitride compound semiconductor layer to a room temperature after the formation of the nitride compound semiconductor layer, a tensile strain applied from the substrate to the strain reducing layer and a compression strain applied from the strain reducing layer to the nitride compound semiconductor layer cancel out each other. In other words, since the nitride compound semiconductor layer having the third thermal expansion coefficient T3 is formed on a multilayer structure composed of the substrate having the first thermal expansion coefficient T1 lower than the third thermal expansion coefficient T3 and the strain reducing layer having the second thermal expansion coefficient T2 higher than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the nitride compound semiconductor layer in response to the tensile stress from the substrate is reduced and cracks are less likely to be formed in the nitride semiconductor layer, so that the crystalline characteristics of the nitride compound semiconductor layer are improved.

In the second semiconductor device, a ratio T3/T1 of the third thermal expansion coefficient T3 to the first thermal expansion coefficient T1 is preferably lower than a ratio T2/T3 of the second thermal expansion coefficient T2 to the third thermal expansion coefficient T3 and the substrate is preferably larger in thickness than the strain reducing layer.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

In the second semiconductor device, a ratio T3/T1 of the third thermal expansion coefficient T3 to the first thermal expansion coefficient T1 is preferably higher than a ratio T2/T3 of the second thermal expansion coefficient T2 to the third thermal expansion coefficient T3 and the substrate is preferably smaller in thickness than the strain reducing layer.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

A first method of fabricating a semiconductor device according to the present invention comprises the steps of: forming a strain reducing layer having a second thermal expansion coefficient T2 on a substrate having a first thermal expansion coefficient T1; and forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$), the second thermal expansion coefficient T2 being lower than the first thermal expansion coefficient T1, the third thermal expansion coefficient T3 being lower than the first thermal expansion coefficient T1 and higher than the second thermal expansion coefficient T2.

In the first method of fabricating a semiconductor device, the strain reducing layer having the second thermal expansion coefficient T2 lower than the first thermal expansion coefficient T1 is formed on the substrate having the first thermal expansion coefficient T1 and then the nitride compound semiconductor layer having the third thermal expansion coefficient T3 lower than the first thermal expansion coefficient T1 and higher than the second thermal expansion coefficient T2 is formed on the strain reducing layer. Accordingly, when the temperature of the substrate is lowered from a temperature for the crystal growth of the nitride compound semiconductor layer to a room temperature after the formation of the nitride compound semiconductor layer, a compression strain applied from the substrate to the strain reducing layer and a tensile strain applied from the strain reducing layer to the nitride compound semiconductor layer cancel out each other. In other words, since the nitride compound semiconductor layer having the third thermal expansion coefficient T3 is formed on a multilayer structure composed of the substrate having the first thermal expansion coefficient T1 higher than the third thermal expansion coefficient T3 and the strain reducing layer having the second thermal expansion coefficient T2 lower than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the nitride compound semiconductor layer in response to the compression strain from the substrate is reduced and cracks are less likely to be formed in the nitride semiconductor layer, so that the crystalline characteristics of the nitride compound semiconductor layer are improved.

In the first method of fabricating a semiconductor device, the step of forming the strain reducing layer preferably includes the step of forming, when a ratio T1/T3 of the first thermal expansion coefficient T1 to the third thermal expansion coefficient T3 is lower than a ratio T3/T2 of the third thermal expansion coefficient T3 to the second thermal expansion coefficient T2, the strain reducing layer such that the strain reducing layer is smaller in thickness than the substrate and forming, when the ratio T1/T3 of the first thermal expansion coefficient T1 to the third thermal expansion coefficient T3 is higher than the ratio T3/T2 of the third thermal expansion coefficient T3 to the second thermal expansion coefficient T2, the strain reducing layer such that the strain reducing layer is larger in thickness than the substrate.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

In the first method of fabricating a semiconductor device, the substrate is preferably made of sapphire and the strain reducing layer is preferably made of silicon.

In the arrangement, the strain reducing layer having a specified growth interface is formed on the substrate, so that the crystalline characteristics of the nitride compound semiconductor layer formed on the strain reducing layer are further improved.

In this case, the step of forming the strain reducing layer preferably includes the step of forming the strain reducing layer having a growth interface having a (111) plane on the substrate having a main surface having a (0001) plane.

In the arrangement, the nitride compound semiconductor layer having a growth interface having a (0001) plane is formed on the strain reducing layer formed to have a growth interface having a (111) plane, so that the crystalline characteristics of the nitride compound semiconductor layer are further improved.

A second method of fabricating a semiconductor device according to the present invention comprises the steps of: forming a strain reducing layer having a second thermal expansion coefficient T2 on a substrate having a first thermal expansion coefficient T1; and forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$), the second thermal expansion coefficient T2 being higher than the first thermal expansion coefficient T1, the third thermal expansion coefficient T3 being higher than the first thermal expansion coefficient T1 and lower than the second thermal expansion coefficient T2.

In the second method of fabricating a semiconductor device, the strain reducing layer having the second thermal expansion coefficient T2 higher than the first thermal expansion coefficient T1 is formed on the substrate having the first thermal expansion coefficient T1 and then the nitride compound semiconductor layer having the third thermal expansion coefficient T3 higher than the first thermal expansion coefficient T1 and lower than the second thermal expansion coefficient T2 is formed on the strain reducing layer. Accordingly, when the temperature of the substrate is lowered from a temperature for the crystal growth of the nitride compound semiconductor layer to a room temperature after the formation of the nitride compound semiconductor layer, a tensile strain applied from the substrate to the strain reducing layer and a compression strain applied from the strain reducing layer to the nitride compound semiconductor layer cancel out each other. In other words, since the nitride compound semiconductor layer having the third thermal expansion coefficient T3 is formed on a multilayer structure composed of the substrate having the first thermal expansion coefficient T1 lower than the third thermal expansion coefficient T3 and the strain reducing layer having the second thermal expansion coefficient T2 higher than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the nitride compound semiconductor layer in response to the tensile stress from the substrate is reduced and cracks are less likely to be formed in the nitride semiconductor layer, so that the crystalline characteristics of the nitride compound semiconductor layer are improved.

In the second method of fabricating a semiconductor device, the step of forming the strain reducing layer preferably includes the step of forming, when a ratio T3/T1 of the third thermal expansion coefficient T3 to the first thermal expansion coefficient T1 is lower than a ratio T2/T3 of the second thermal expansion coefficient T2 to the third thermal expansion coefficient T3, the strain reducing layer such that the strain reducing layer is smaller in thickness than the substrate and forming, when the ratio T3/T1 of the third thermal expansion coefficient T3 to the first thermal expansion coefficient T1 is higher than the ratio T2/T3 of the second thermal expansion coefficient T2 to the third thermal expansion coefficient T3, the strain reducing layer such that the strain reducing layer is larger in thickness than the substrate.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

A third method of fabricating a semiconductor device according to the present invention comprises the steps of: forming a strain reducing layer having a second thermal expansion coefficient T2 on a substrate having a first thermal expansion coefficient T1; forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$); and separating the nitride compound semiconductor layer from a multilayer structure composed of the substrate and the strain reducing layer to form a semiconductor substrate composed of the nitride compound semiconductor layer, the second thermal expansion coefficient T2 being lower than the first thermal expansion coefficient T1, the third thermal expansion coefficient T3 being lower than the first thermal expansion coefficient T1 and higher than the second thermal expansion coefficient T2.

In the third method of fabricating a semiconductor device, the strain reducing layer having the second thermal expansion coefficient T2 lower than the first thermal expansion coefficient T1 is formed on the substrate having the first thermal expansion coefficient T1 and then the nitride compound semiconductor layer having the third thermal expansion coefficient T3 lower than the first thermal expansion coefficient T1 and higher than the second thermal expansion coefficient T2 is formed on the strain reducing layer. Accordingly, when the temperature of the substrate is lowered from a temperature for the crystal growth of the nitride compound semiconductor layer to a room temperature after the formation of the nitride compound semiconductor layer, a compression strain applied from the substrate to the strain reducing layer and a tensile strain applied from the strain reducing layer to the nitride compound semiconductor layer cancel out each other. In other words, since the nitride compound semiconductor layer having the third thermal expansion coefficient T3 is formed on a multilayer structure composed of the substrate having the first thermal expansion coefficient T1 higher than the third thermal expansion coefficient T3 and the strain reducing layer having the second thermal expansion coefficient T2 lower than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the nitride compound semiconductor layer in response to the compression strain from the substrate is reduced and cracks are less likely to be formed in the nitride semiconductor layer, so that the crystalline characteristics of the nitride compound semiconductor layer are improved. By separating the nitride compound semiconductor layer from the multilayer structure composed of the substrate and the strain reducing layer, therefore, the semiconductor substrate composed of the nitride semiconductor layer with excellent crystalline characteristics can be formed.

In the third method of fabricating a semiconductor device, the step of forming the strain reducing layer preferably includes the step of forming, when a ratio T1/T3 of the first thermal expansion coefficient T1 to the third thermal expansion coefficient T3 is lower than a ratio T3/T2 of the third thermal expansion coefficient T3 to the second thermal expansion coefficient T2, the strain reducing layer such that the strain reducing layer is smaller in thickness than the substrate and forming, when the ratio T1/T3 of the first thermal expansion coefficient T1 to the third thermal expansion coefficient T3 is higher than the ratio T3/T2 of the third thermal expansion coefficient T3 to the second thermal expansion coefficient T2, the strain reducing layer such that the strain reducing layer is larger in thickness than the substrate.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

In the third method of fabricating a semiconductor device, the substrate is preferably made of sapphire and the strain reducing layer is preferably made of silicon.

In the arrangement, the strain reducing layer having a specified growth interface is formed on the substrate, so that the crystalline characteristics of the nitride compound semiconductor layer formed on the strain reducing layer are further improved.

In this case, the step of forming the strain reducing layer preferably includes the step of forming the strain reducing layer having a growth interface having a (111) plane on the substrate having a main surface having a (0001) plane.

In the arrangement, the nitride compound semiconductor layer having a growth interface having a (0001) plane is formed on the strain reducing layer formed to have a growth interface having a (111) plane, so that the crystalline characteristics of the nitride compound semiconductor layer are further improved.

In this case, the step of forming the semiconductor substrate preferably includes the step of removing the strain reducing layer by using a solution containing a hydrofluoric acid.

The arrangement allows the nitride compound semiconductor layer to be separated from the multilayer structure composed of the substrate and the strain reducing layer without removing the substrate by polishing. Accordingly, the semiconductor substrate composed of the nitride compound semiconductor layer can be formed easily in a short period of time and the substrate separated from the nitride compound semiconductor layer can be used again to newly form a nitride compound semiconductor layer.

A fourth method of fabricating a semiconductor device according to the present invention comprises the steps of: forming a strain reducing layer having a second thermal expansion coefficient T2 on a substrate having a first thermal expansion coefficient T1; forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$); and separating the nitride compound semiconductor layer from a multilayer structure composed of the substrate and the strain reducing layer to form a semiconductor substrate composed of the nitride compound semiconductor layer, the second thermal expansion coefficient T2 being higher than the first thermal expansion coefficient T1, the third thermal expansion coefficient T3 being higher than the first thermal expansion coefficient T1 and lower than the second thermal expansion coefficient T2.

In the fourth method of fabricating a semiconductor device, the strain reducing layer having the second thermal expansion coefficient T2 higher than the first thermal expansion coefficient T1 is formed on the substrate having the first thermal expansion coefficient T1 and then the nitride compound semiconductor layer having the third thermal expansion coefficient T3 higher than the first thermal expansion coefficient T1 and lower than the second thermal expansion coefficient T2 is formed on the strain reducing layer. Accordingly, when the temperature of the substrate is lowered from a temperature for the crystal growth of the nitride compound semiconductor layer to a room temperature after the formation of the nitride compound semiconductor layer, a tensile strain applied from the substrate to the strain reducing layer and a compression strain applied from the strain reducing layer to the nitride compound semiconductor layer cancel out each other. In other words, since the nitride compound semiconductor layer having the third thermal expansion coefficient T3 is formed on a multilayer structure composed of the substrate having the first thermal expansion coefficient T1 lower than the third thermal expansion coefficient T3 and the strain reducing layer having the second thermal expansion coefficient T2 higher than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the nitride compound semiconductor layer in response to the tensile stress from the substrate is reduced and cracks are less likely to be formed in the nitride semiconductor layer, so that the crystalline characteristics of the nitride compound semiconductor layer are improved. By separating the nitride compound semiconductor layer from the multilayer structure composed of the substrate and the strain reducing layer, therefore, the semiconductor substrate composed of the nitride semiconductor layer with excellent crystalline characteristics can be formed.

In the fourth method of fabricating a semiconductor device, the step of forming the strain reducing layer preferably includes the step of forming, when a ratio T3/T1 of the third thermal expansion coefficient T3 to the first thermal expansion coefficient T1 is lower than a ratio T2/T3 of the second thermal expansion coefficient T2 to the third thermal expansion coefficient T3, the strain reducing layer such that the strain reducing layer is smaller in thickness than the substrate and forming, when the ratio T3/T1 of the third thermal expansion coefficient T3 to the first thermal expansion coefficient T1 is higher than the ratio T2/T3 of the second thermal expansion coefficient T2 to the third thermal expansion coefficient T3, the strain reducing layer such that the strain reducing layer is larger in thickness than the substrate.

The arrangement further reduces the difference between the mean value of the thermal expansion coefficients of the multilayer structure composed of the substrate and the strain reducing layer and the third thermal expansion coefficient T3, so that the crystalline characteristics of the nitride compound semiconductor layer are further improved.

DETAILED DESCRIPTION OF THE INVENTION

Embodiment 1

Referring now to FIGS. 1(a) to (d), a description will be given to a semiconductor device and a method of fabricating the same according to a first embodiment of the present invention by using a laser diode as an example.

Figure 1A:
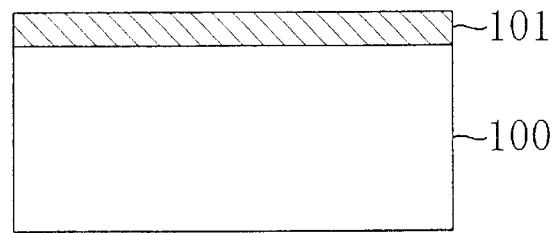
FIGS. 1(a) to (d) are cross-sectional views illustrating the individual process steps of a method of fabricating a semiconductor device according to a first embodiment of the present invention.

First, as shown in FIG. 1(a), a silicon crystal is grown by vapor phase epitaxy (hereinafter referred to as CVD) using a gas containing silicon, such as monosilane or dichlorosilane ($SiH_2Cl_2$), on a substrate 100 made of, e.g., sapphire and having a thickness of 300 $\mu$m to form a strain reducing layer 101 made of silicon and having a thickness of, e.g., 1.5 $\mu$m. At this time, the substrate 100 is formed to have a main surface having a (0001) plane, whereby the strain reducing layer 101 having a growth interface having a (111) plane is formed.

Figure 1B:
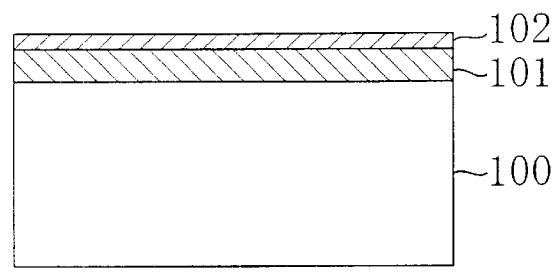

Next, the temperature of the substrate 100 is adjusted to 500° C. and MOVPE is performed under a reduced pressure by using, e.g., trimethylgallium, trimethylaluminium, and ammonia as raw material gases to grow an AlN crystal on the strain reducing layer 101 and thereby form an AlN layer 102 having a thickness of, e.g., 0.05 $\mu$m as a buffer layer, as shown in FIG. 1(b). In the first embodiment, the temperature of the substrate 100 is defined as a temperature including the strain reducing layer 101 or the like formed on the substrate 100.

Figure 1C:
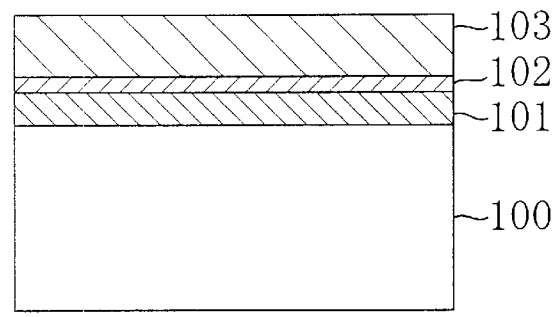

Then, the temperature of the substrate 100 is adjusted to 1000° C. and MOVPE is performed under a reduced pressure by using, e.g., trimethylgallium, trimethylaluminium, and ammonia as raw material gases, similarly to the case of forming the AlN layer 102, to grow a GaN crystal on the AlN layer 102 and thereby form a GaN layer 103 having a thickness of 3.0 $\mu$m as a first contact layer, as shown in FIG. 1(c). The GaN layer 103 is doped with impurity such as Si, Ge, or Se to have the n-type conductivity.

Table 1 shows the respective thermal expansion coefficients of sapphire, silicon, and GaN.

TABLE 1

| | THERMAL EXPANSION COEFFICIENT ($\times 10^{-6}$/K) |
|---|---|
| SAPPHIRE | 7.5 |
| SILICON | 2.55 |
| GaN | 5.59 |

In the first embodiment, the substrate 100 made of sapphire has a thermal expansion coefficient of $7.5 \times 10^{-6}$/K (hereinafter referred to as a first thermal expansion coefficient T1), the strain reducing layer 101 made of silicon has a thermal expansion coefficient of $2.55 \times 10^{-6}$/K (hereinafter referred to as a second thermal expansion coefficient T2), and the GaN layer 103 has a thermal expansion coefficient of $5.59 \times 10^{-6}$/K (hereinafter referred to as a third thermal expansion coefficient T3), as shown in Table 1. Briefly, the second thermal expansion coefficient T2 is lower than the first thermal expansion coefficient T1 and the third thermal expansion coefficient T3 is lower than the first thermal expansion coefficient T1 and higher than the second thermal expansion coefficient T2.

Figure 1D:
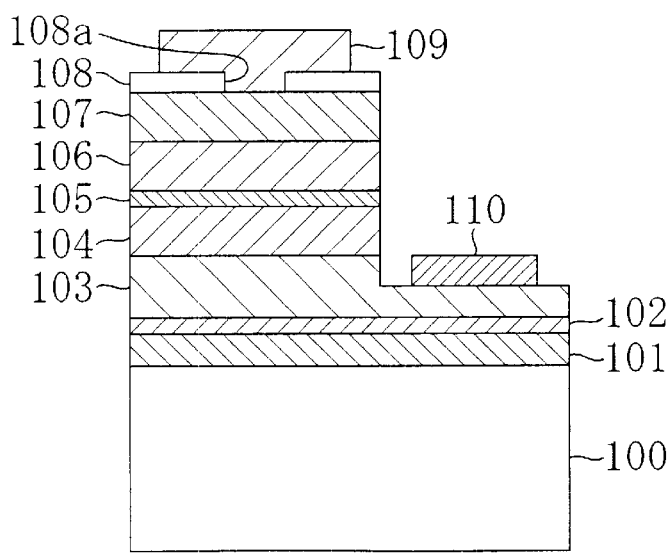

Next, as shown in FIG. 1(d), a first clad layer 104 made of n-type AlGaN, an active layer 105 made of undoped GaInN, a second clad layer 106 made of p-type AlGaN, and a second contact layer 107 made of p-type GaN are formed successively on the GaN layer 103. Subsequently, a device structure composed of the GaN layer 103, i.e., the first contact layer, the first clad layer 104, the active layer 105, the second clad layer 106, and the second contact layer 107 is partially removed by etching till the GaN layer 103 is etched halfway. After the formation of the device structure, the temperature of the substrate 100 is lowered from a temperature (about 1000° C.) for the crystal growth of the GaN layer 103 or the like to a room temperature. Thereafter, a p-type electrode 109 made of an Ni—Au alloy is formed on the second contact layer 107 with a current restricting layer 108 having an opening 108a interposed therebetween and an n-type electrode 110 made of an Ni—Au alloy is formed in a space corresponding to the etched portion of the GaN layer 103, i.e., the first contact layer, whereby the laser diode is completed.

According to the first embodiment, as described above, the train reducing layer 101 having the second thermal expansion coefficient T2 lower than the first thermal expansion coefficient T1 is formed on the substrate 100 having the first thermal expansion coefficient T1 and the GaN layer 103 having the third thermal expansion coefficient T3 lower than the first thermal expansion coefficient T1 and higher than the second thermal expansion coefficient T2 is formed on the strain reducing layer 101. Accordingly, when the temperature of the substrate 100 is lowered from the temperature for the crystal growth of the GaN layer 103 to a room temperature after the formation of the GaN layer 103, a compression strain applied from the substrate 100 to the strain reducing layer 101 and a tensile strain applied from the strain reducing layer 101 to the GaN layer 103 cancel out each other. In other words, since the GaN layer 103 having the third thermal expansion coefficient T3 is formed on a multilayer structure composed of the substrate 100 having the first thermal expansion coefficient T1 higher than the third thermal expansion coefficient T3 and the strain reducing layer 101 having the second thermal expansion coefficient T2 lower than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. Consequently, the internal stress produced in the GaN layer 103 in response to the compression strain from the substrate 100 is reduced and cracks are less likely to be formed in the GaN layer 103. This improves the crystalline characteristics of the GaN layer 103 and the crystalline characteristics of the device structure formed on the GaN layer 103.

Since the first embodiment has formed the strain reducing layer 101 made of silicon on the substrate 100 made of sapphire, the strain reducing layer 101 has a specified growth interface so that the crystalline characteristics of the GaN layer 103 formed on the strain reducing layer 101 are further improved. By forming the substrate 100 made of sapphire and having a main surface having a (0001) plane, for example, the strain reducing layer 101 made of silicon and having a growth interface having a (111) plane is formed so that the GaN layer 103 with a growth interface having a (0001) plane is formed on the strain reducing layer 101. This further improves the crystalline characteristics of the GaN layer 103.

The foregoing effect will be described in greater detail with reference to FIG. 2.

Figure 2:
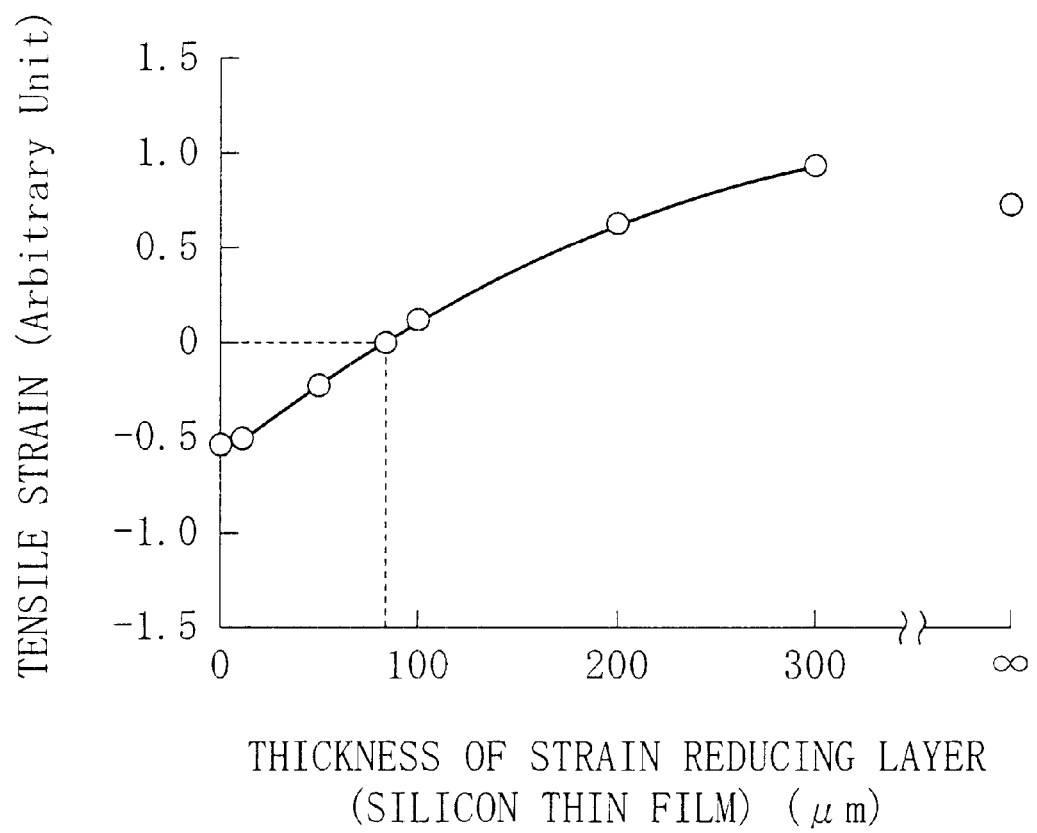
FIG. 2 shows the relationship between the thickness of a strain reducing layer made of silicon and a strain applied from a multilayer structure composed of a substrate and the strain reducing layer to a GaN layer in the semiconductor device according to the first embodiment.

FIG. 2 shows the relationship between the thickness of the strain reducing layer 101 made of silicon and a tensile strain applied from the multilayer structure composed of the substrate 100 and the strain reducing layer 101 to the GaN layer 103 when the temperature of the substrate 100 is lowered from 1000° C. to a room temperature. If the tensile strain represented by the vertical axis in FIG. 2 has a negative value, it indicates that the compression strain is applied to the GaN layer 103. If the thickness of the strain reducing layer 101, i.e., a silicon thin film represented by the horizontal axis has an infinite value (∞), it indicates that the GaN layer 103 has been formed by crystal growth on a substrate composed of silicon in place of the substrate 100 composed of sapphire. The substrate 100 has a thickness of 300 μm and the GaN layer 103 has a thickness of 3 μm.

As shown in FIG. 2, a compression strain is applied to the GaN layer 103 if the thickness of the strain reducing layer 101 is about 80 μm or less. If the thickness of the strain reducing layer 101 is more than about 80 μm, on the other hand, a tensile strain is applied to the GaN layer 103. The reason for this may be that, if the thickness of the strain reducing layer 101 is about 80 μm or less, the compression strain applied from the substrate 100 to the GaN layer 103 is higher than the tensile strain applied from the strain reducing layer 101 to the GaN layer 103 and, if the thickness of the strain reducing layer 101 is more than about 80 μm, on the other hand, the compression strain applied from the substrate 100 to the GaN layer 103 is smaller than the tensile strain applied from the strain reducing layer 101 to the GaN layer 103.

If the thickness of the strain reducing layer 101, i.e., the thickness of the silicon thin film is about 80 μm, it may be considered that the compression strain applied from the substrate 100 to the GaN layer 103 and the tensile strain applied from the strain reducing layer 101 to the GaN layer 103 are balanced and therefore the strain applied from the multilayer structure composed of the substrate 100 and the strain reducing layer 101 to the GaN layer 103 is minimized.

As a result of examining, by surface observation using an optical microscope, variations in the number of cracks formed in the GaN layer 103 when the thickness of the strain reducing layer 101, i.e., the thickness of the silicon thin film was varied in a semiconductor device comprising the GaN layer 103 shown in FIG. 1(c), it was found that cracks were barely formed in the GaN layer 103 when the thickness of the strain reducing layer 101 is about 100 μm or less and that cracks are formed in the GaN layer 103 when the thickness of the strain reducing layer 101 is more than about 100 μm and the number of cracks formed in the GaN layer 103 increased as the thickness of the strain reducing layer 101 increased.

From the result of examination, it can be considered that cracks are less likely to be formed when the compression strain is applied to the GaN layer 103 formed on the strain reducing layer 101, i.e., the silicon thin film and that, when the tensile strain is applied to the GaN layer 103, cracks are more likely to be formed and the number of cracks increases as the tensile strain increases.

In the first embodiment, if the ratio T1/T3 of the first thermal expansion coefficient T1 (substrate 100) to the third thermal expansion coefficient T3 (GaN layer 103) is lower than the ratio T3/T2 of the third thermal expansion coefficient T3 to the second thermal expansion coefficient T2 (strain reducing layer 101), the strain reducing layer 101 is preferably formed to have a thickness smaller than the thickness of the substrate 100. Conversely, if the ratio T1/T3 of the first thermal expansion coefficient T1 to the thermal expansion coefficient T3 is higher than the ratio T3/T2 of the third thermal expansion coefficient T3 to the second thermal expansion coefficient T2, the strain reducing layer 101 is preferably formed to have a thickness larger than the thickness of the substrate 100. The arrangement further reduces the difference between a mean value of the thermal expansion coefficients of the multilayer structure composed of the substrate 100 and the strain reducing layer 101 and the third thermal expansion coefficient T3, so that the crystalline characteristics of the GaN layer 103 are further improved.

Specifically, since the GaN layer 103 having a thermal expansion coefficient of $5.59 \times 10^{-6}$/K (third thermal expansion coefficient T3) is formed on the substrate 100 made of sapphire having a thermal expansion coefficient of $7.5 \times 10^{-6}$/K (first thermal expansion coefficient T1) with the strain reducing layer 101 made of silicon having a thermal expansion coefficient of $2.55 \times 10^{-6}$/K (second thermal expansion coefficient T2) interposed therebetween, the ratio T1/T3 (about 1.34) of the first thermal expansion coefficient T1 to the third thermal expansion coefficient T3 is lower than the ratio T3/T2 (about 2.19) of the third thermal expansion coefficient T3 to the second thermal expansion coefficient T2, so that the thickness of the strain reducing layer 101 is made smaller than the thickness of the substrate 100. At this time, if the substrate 100 has a thickness of, e.g., 300 μm, the formation of the strain reducing layer 101 having a thickness of about 100 μm or less surely improves the crystalline characteristics of the GaN layer 103. If the thickness of the strain reducing layer 101 is adjusted to 80 μm or less, in particular, it becomes possible to prevent the tensile strain from being applied from the multilayer structure composed of the substrate 100 and the strain reducing layer 101 to the GaN layer 103 (see FIG. 2), so that the formation of cracks in the GaN layer 103 is prevented reliably.

Although the first embodiment has used the substrate 100 made of sapphire, it is also possible to use instead a substrate made of ZnO (with a thermal expansion coefficient of $8.25 \times 10^{-6}$/K), GaAs (with a thermal expansion coefficient of $6.0 \times 10^{-6}$/K), MgO (with a thermal expansion coefficient of $10.5 \times 10^{-6}$/K), $MgAlO_2$ (with a thermal expansion coefficient of $7.45 \times 10^{-6}$/K), BeO (with a thermal expansion coefficient of $7.3 \times 10^{-6}$/K), or the like.

Although the first embodiment has used the strain reducing layer 101 made of silicon, it is also possible to use instead a strain reducing layer made of SiC (with a thermal expansion coefficient of $3.7 \times 10^{-6}$/K), InP (with a thermal expansion coefficient of $4.5 \times 10^{-6}$/K), diamond (with a thermal expansion coefficient of $2.3 \times 10^{-6}$/K), BP (with a thermal expansion coefficient of $3.0 \times 10^{-6}$/K), or the like.

Although the first embodiment has formed the AlN layer 102 as the buffer layer, the present invention is not limited thereto. It is also possible to form a layer made of a nitride compound represented by $Al_xGa_{1-x}N$ ($0<x\leq1$) as the buffer layer.

Although the first embodiment has formed the GaN layer 103 on the strain reducing layer 101 with the buffer layer interposed therebetween, the present invention is not limited thereto. It is also possible to form a semiconductor layer made of a nitride compound represented by $Al_yGa_{1-y-z}In_zN$ ($0\leq y\leq1$, $0\leq z\leq1$) on the strain reducing layer 101 with the buffer layer interposed therebetween by supplying a gallium raw material, an aluminium raw material, and an indium raw material at an appropriate mixing ratio.

In the case of imparting the n-type conductivity to the GaN layer 103 in the first embodiment, it is preferable to use a raw material containing a Group IV element or a Group VI element and dope the GaN layer 103 with, as an impurity, a Group IV element such as Si or Ge or a Group VI element such as Se. In the case of imparting the p-type conductivity to the GaN layer 103, it is preferable to use a raw material containing a Group II element and dope the GaN layer 103 with, as an impurity, a Group II element such as Be, Mg, or Zn.

Although the first embodiment has formed the strain reducing layer 101 made of silicon on the substrate 100 made of sapphire by crystal growth, it is possible to bond a first substrate made of sapphire and having a specified thickness to a second substrate made of silicon and having a specified thickness. Alternatively, it is also possible to bond a first substrate made of sapphire to a second substrate made of silicon and then polish the first or second substrate to a specified thickness.

Although the first embodiment has formed the laser diode comprising the GaN layer 103 and the device structure formed thereon, the present invention is not limited thereto. It is also possible to form another device comprising a nitride compound semiconductor layer such as a light-emitting diode or a high-speed transistor.

Although the first embodiment has formed the laser diode on the strain reducing layer 101 made of silicon, i.e., on the silicon thin film, it is also possible to selectively form a first device such as an integrated circuit comprising a silicon semiconductor layer on a silicon thin film and a second device such as a laser diode comprising a nitride compound semiconductor layer on the silicon thin film. The arrangement implements an integrated circuit in which an optical function and an electronic function are fused, i.e., an OEIC (optoelectronic IC).

Embodiment 2

Referring to FIGS. 3(a) to (d), a description will be given to a semiconductor device and a method of fabricating the same according to a second embodiment of the present invention by using a laser diode as an example.

Figure 3A:
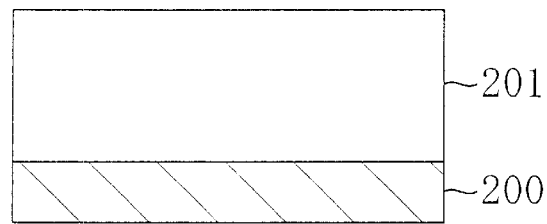
FIGS. 3(a) to (d) are cross-sectional views illustrating the individual process steps of a method of fabricating a semiconductor device according to a second embodiment of the present invention.
Figure 3B:
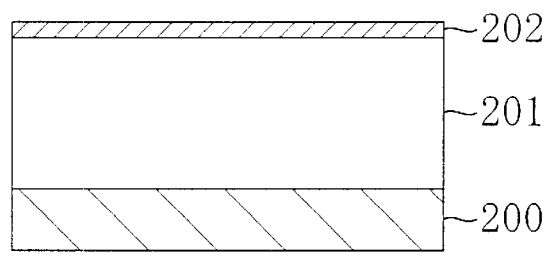

First, a first substrate made of, e.g., silicon and having a thickness of 300 μm and a second substrate made of, e.g., sapphire and a having a thickness of 300 μm are bonded to each other. Then, the first substrate is polished to have a thickness of about 80 μm such that the second substrate, i.e., a strain reducing layer 201 made of sapphire and a having a thickness of 300 μm is formed on the first polished substrate, i.e., a substrate 200 made of silicon and having a thickness of about 80 μm, as shown in FIG. 3(a).

Next, the temperature of the substrate 200 is adjusted to 500° C. and MOVPE is performed under a reduced pressure by using, e.g., trimethylgallium, trimethylaluminium, and ammonia as raw material gases to grow an AlN crystal on the strain reducing layer 201 and thereby form an AlN layer 202 having a thickness of, e.g., 0.05 μm as a buffer layer, as shown in FIG. 3 (b). In the second embodiment, the temperature of the substrate 200 is defined as a temperature including the strain reducing layer 201 or the like formed on the substrate 200.

Figure 3C:
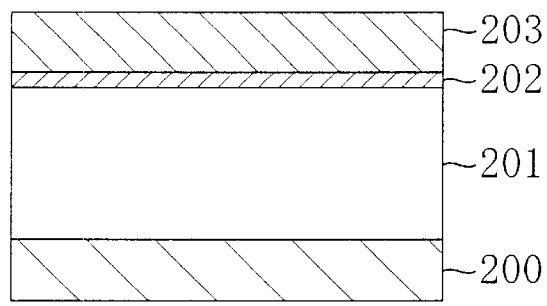

Then, the temperature of the substrate 200 is adjusted to 1000° C. and MOVPE is performed under a reduced pressure by using, e.g., trimethylgallium, trimethylaluminium, and ammonia as raw material gases, similarly to the case of forming the AlN layer 202, to grow a GaN crystal on the AlN layer 202 and thereby form a GaN layer 203 having a thickness of 3.0 μm as a first contact layer, as shown in FIG. 3(c). The GaN layer 203 is doped with an impurity such as Si, Ge, or Se to have the n-type conductivity.

In the second embodiment, the substrate 200 made of silicon has a thermal expansion coefficient of $2.55 \times 10^{-6}$/K (hereinafter referred to as a first thermal expansion coefficient T1), the strain reducing layer 201 made of sapphire has a thermal expansion coefficient of $7.5 \times 10^{-6}$/K (hereinafter referred to as a second thermal expansion coefficient T2), and the GaN layer 203 has a thermal expansion coefficient of $5.59 \times 10^{-6}$/K (hereinafter referred to as a third thermal expansion coefficient T3), as shown in Table 1 (see EMBODIMENT 1). Briefly, the second thermal expansion coefficient T2 is higher than the first thermal expansion coefficient T1 and the third thermal expansion coefficient T3 is higher than the first thermal expansion coefficient T1 and lower than the second thermal expansion coefficient T2.

Figure 3D:
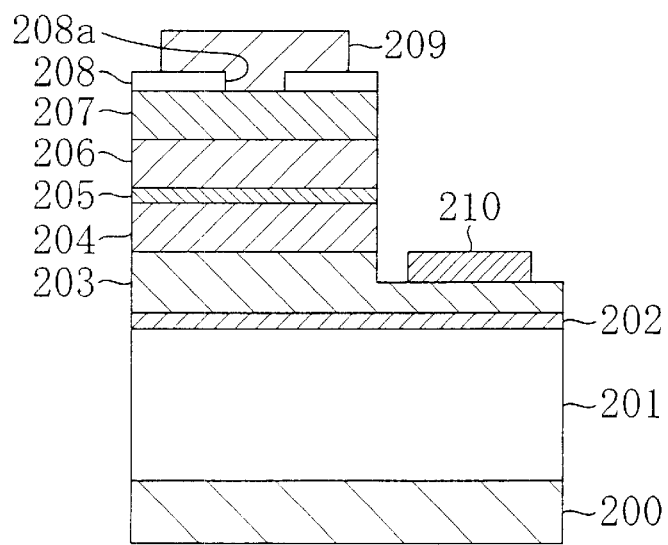

Next, as shown in FIG. 3(d), a first clad layer 204 made of n-type AlGaN, an active layer 205 made of undoped GaInN, a second clad layer 206 made of p-type AlGaN, and a second contact layer 207 made of p-type GaN are formed successively on the GaN layer 203. Subsequently, a device structure composed of the GaN layer 203, i.e., the first contact layer, the first clad layer 204, the active layer 205, the second clad layer 206, and the second contact layer 207 is partially removed by dry etching till the GaN layer 203 is etched halfway. After the formation of the device structure, the temperature of the substrate 200 is lowered from a temperature (about 1000° C.) for the crystal growth of the GaN layer 203 to a room temperature. Thereafter, a p-type electrode 209 composed of an Ni—Au alloy is formed on the second contact layer 207 with a current restricting layer 208 having an opening 208a interposed therebetween and an n-type electrode 210 composed of an Ni—Au alloy is formed in a space corresponding to the etched portion of the GaN layer 203, i.e., the first contact layer, whereby the laser diode is completed.

According to the second embodiment, as described above, the strain reducing layer 201 having the second thermal expansion coefficient T2 higher than the first thermal expansion coefficient T1 is formed on the substrate 200 having the first thermal expansion coefficient T1 and the GaN layer 203 having the third thermal expansion coefficient T3 higher than the first thermal expansion coefficient T1 and lower than the second thermal expansion coefficient T2 is formed on the strain reducing layer 201. Accordingly, when the temperature of the substrate 200 is lowered from the temperature for the crystal growth of the GaN layer 203 to a room temperature after the formation of the GaN layer 203, a tensile strain applied from the substrate 200 to the strain reducing layer 201 and a compression strain applied from the strain reducing layer 201 to the GaN layer 203 cancel out each other. In other words, since the GaN layer 203 having a third thermal expansion coefficient T3 is formed on a multilayer structure composed of the substrate 200 having the first thermal expansion coefficient T1 lower than the third thermal expansion coefficient T3 and the strain reducing layer 201 having the second thermal expansion coefficient T2 higher than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. As a result, an internal stress produced in the GaN layer 203 in response to the tensile strain from the substrate 200 is reduced and cracks are less likely to be formed in the GaN layer 203. This improves the crystalline characteristics of the GaN layer 203 and the crystalline characteristics of the device structure formed on the GaN layer 203.

In the second embodiment, if the ratio T3/T1 of the third thermal expansion coefficient T3 (GaN layer 203) to the first thermal expansion coefficient T1 (substrate 200) is lower than the ratio T2/T3 of the second thermal expansion coefficient T2 (strain reducing layer 201) to the third thermal expansion coefficient T3, the strain reducing layer 201 is preferably formed to have a thickness smaller than the thickness of the substrate 200. Conversely, if the ratio T3/T1 of the third thermal expansion coefficient T3 to the first expansion coefficient T1 is higher than the ratio T2/T3 of the second thermal expansion coefficient T2 to the third thermal expansion coefficient T3, the strain reducing layer 201 is preferably formed to have a thickness larger than the thickness of the substrate 200. This further reduces the difference between a mean value of the thermal expansion coefficients of the multilayer structure composed of the substrate 200 and the strain reducing layer 201 and the third thermal expansion coefficient T3 and further improves the crystalline characteristics of the GaN layer 203.

Specifically, since the GaN layer 203 having a thermal expansion coefficient of $5.59 \times 10^{-6}/K$ (third thermal expansion coefficient T3) is formed on the substrate 200 made of silicon having a thermal expansion coefficient of $2.55 \times 10^{-6}/K$ (first thermal expansion coefficient T1) with the strain reducing layer 201 made of sapphire having a thermal expansion coefficient of $7.5 \times 10^{-6}/K$ (second thermal expansion coefficient T2) interposed therebetween, the ratio T3/T1 (about 2.19) of the third thermal expansion coefficient T3 to the first thermal expansion coefficient T1 is higher than the ratio T2/T3 (about 1.34) of the second thermal expansion coefficient T2 to the third thermal expansion coefficient T3, so that the thickness of the strain reducing layer 201 is made larger than the thickness of the substrate 200.

Although the second embodiment has used the substrate 200 made of silicon, it is also possible to use instead a substrate made of SiC (with a thermal expansion coefficient of $3.7 \times 10^{-6}/K$), InP (with a thermal expansion coefficient of $4.5 \times 10^{-6}/K$), diamond (with a thermal expansion coefficient of $2.3 \times 10^{-6}/K$), BP (with a thermal expansion coefficient of $3.0 \times 10^{-6}/K$), or the like.

Although the second embodiment has used the strain reducing layer 201 made of sapphire, it is also possible to use instead a strain reducing layer made of ZnO (with a thermal expansion coefficient of $8.25 \times 10^{-6}/K$), GaAs (with a thermal expansion coefficient of $6.5 \times 10^{-6}/K$), MgO (with a thermal expansion coefficient of $10.5 \times 10^{-6}/K$), $MgAlO_2$ (with a thermal expansion coefficient of $7.45 \times 10^{-6}/K$), BeO (with a thermal expansion coefficient of $7.3 \times 10^{-6}/K$), or the like.

Although the second embodiment has formed the AlN layer 202 as the buffer layer, the present invention is not limited thereto. It is also possible to form a layer made of a nitride compound represented by $Al_xGa_{1-x}N$ ($0 \leq x \leq 1$) as the buffer layer.

Although the second embodiment has formed the GaN layer 203 on the strain reducing layer 201 with the buffer layer interposed therebetween, the present invention is not limited thereto. It is also possible to form a semiconductor layer made of a nitride compound represented by $Al_yGa_{1-y-z}In_zN$ ($0 \leq y \leq 1$, $0 \leq z \leq 1$) on the strain reducing layer 201 with the buffer layer interposed therebetween by supplying a gallium raw material, an aluminium raw material, and an indium raw material at an appropriate mixing ratio.

In the case of imparting the n-type conductivity to the GaN layer 203 in the second embodiment, it is preferable to use a raw material containing a Group IV element or a Group VI element and dope the GaN layer 203 with, as an impurity, a Group IV element such as Si or Ge or a Group VI element such as Se. In the case of imparting the p-type conductivity to the GaN layer 203, it is preferable to use a raw material containing a Group II element and dope the GaN layer 203 with, as an impurity, a Group II element such as Be, Mg, or Zn.

Although the second embodiment has bonded the first substrate made of silicon to the second substrate made of sapphire and polished only the first substrate to a specified thickness, it is also possible to bond the first substrate made of silicon to the second substrate made of sapphire and polish both the first and second substrates or only the second substrate to a specified thickness. Alternatively, it is also possible to bond a first substrate made of silicon and having a specified thickness to a second substrate made of sapphire and having a specified thickness.

Although the second embodiment has formed the laser diode having the GaN layer 203 on the multilayer structure composed of the substrate 200 and the strain reducing layer 201, it is also possible to form instead a GaN thick film on the multilayer structure composed of the substrate 200 and the strain reducing layer 201, separate the multilayer structure from the GaN thick film to form a semiconductor substrate composed of the GaN thick film, and then form a laser diode on the semiconductor substrate.

Although the second embodiment has formed the laser diode comprising the GaN layer 203 and the device structure formed thereon, the present invention is not limited thereto. It is also possible to form another device comprising a nitride compound semiconductor layer such as a light-emitting diode or a high-speed transistor.

Embodiment 3

Referring to FIGS. 4(*a*) to (*d*), a description will be given to a semiconductor device and a method of fabricating the same according to a third embodiment of the present invention by using a laser diode as an example.

First, as shown in FIG. 4(*a*), a silicon crystal is grown by CVD using a gas containing silicon, such as a monosilane or dichlorosilane, on a substrate 300 made of, e.g., sapphire and having a thickness of 300 µm to form a strain reducing layer 301 made of silicon and having a thickness of, e.g., 80 µm. At this time, the substrate 300 is formed to have a main surface having a (0001) plane, whereby the strain reducing layer 301 having a growth interface having a (111) plane is formed. Thereafter, the temperature of the substrate 300 is adjusted to 500° C. and MOVPE is performed under a reduced pressure by using, e.g., trimethylgallium, trimethylaluminium, and ammonia as raw material gases to grow an AlN crystal on the strain reducing layer 301 and thereby form an AlN layer 302 having a thickness of, e.g., 0.05 μm as a buffer layer, as shown in FIG. 4(a).

In the third embodiment, the temperature of the substrate 300 is defined as a temperature including the strain reducing layer 301 or the like formed on the substrate 300.

In the third embodiment, the substrate 300 has a circular configuration with a diameter of about 2 inches.

Figure 4A:
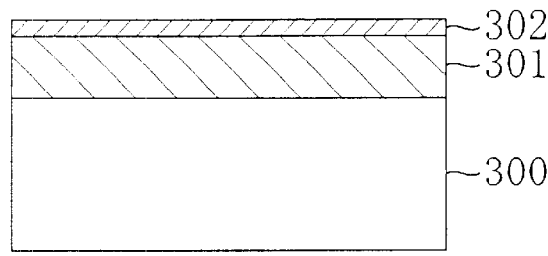
FIGS. 4(a) to (d) are cross-sectional views illustrating the individual process steps of a method of fabricating a semiconductor device according to a third embodiment of the present invention.
Figure 4B:
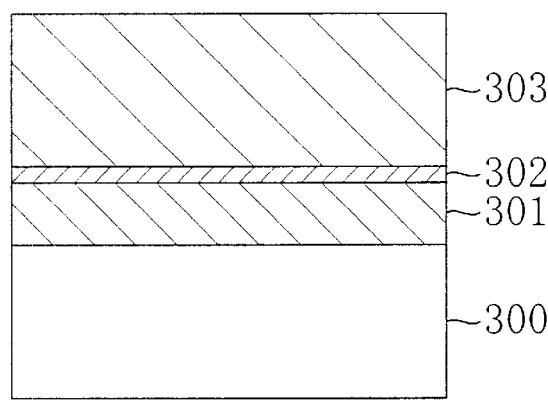

Next, the temperature of the substrate 300 is adjusted to 1000° C. and hydride VPE (hereinafter referred to as HVPE) is performed under normal pressure by using gallium chloride and ammonia as raw materials to grow a GaN crystal on the AlN layer 302 and thereby form a GaN thick film 303 having a thickness of, e.g., 300 μm, as shown in FIG. 4(b). After the formation of the GaN thick film 303, the temperature of the substrate 300 is lowered from a temperature (1000° C.) for the crystal growth of the GaN thick film 303 to a room temperature. Gallium chloride, which is used as the raw material in the HVPE process, is generated by bringing a hydrogen chloride gas into contact with a metal gallium heated to 800° C.

In the third embodiment, the substrate 300 made of sapphire has a thermal expansion coefficient of $7.5 \times 10^{-6}$/K (hereinafter referred to as a first thermal expansion coefficient T1), the strain reducing layer 301 made of silicon has a thermal expansion coefficient of $2.55 \times 10^{-6}$/K (hereinafter referred to as a second thermal expansion coefficient T2), and the GaN thick film 303 has a thermal expansion coefficient of $5.59 \times 10^{-6}$/K (hereinafter referred to as a third thermal expansion coefficient T3), as shown in Table 1 (see EMBODIMENT 1). Briefly, the second thermal expansion coefficient T2 is lower than the first thermal expansion coefficient T1 and the third thermal expansion coefficient T3 is lower than the first thermal expansion coefficient T1 and higher than the second thermal expansion coefficient T2.

Figure 4C:
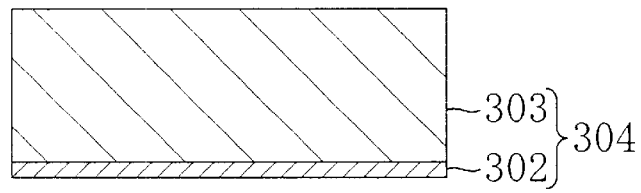

Next, the strain reducing layer 301 made of silicon is removed by using a solution containing, e.g., a hydrofluoric acid, a nitric acid, and water at a mixing ratio of 1:1:2, whereby the GaN thick film 303 and the AlN layer 302 are separated from a multilayer structure composed of the substrate 300 and the strain reducing layer 301 to form a semiconductor substrate 304 composed of the GaN thick film 303 and the AlN layer 302, as shown in FIG. 4(c).

Figure 4D:
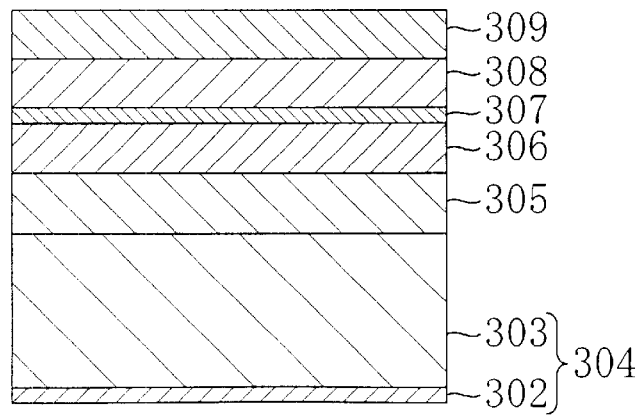

Next, as shown in FIG. 4(d), a first contact layer 305 made of n-type GaN, a first clad layer 306 made of n-type AlGaN, an active layer 307 made of undoped GaInN, a second clad layer 308 made of p-type AlGaN, and a second contact layer 309 made of p-type GaN are formed successively on the semiconductor substrate 304. Thereafter, a p-type electrode is formed on the second contact layer 309 with a current restricting layer interposed therebetween and an n-type electrode is formed on a back surface of the semiconductor substrate 304, though they are not depicted, whereby the laser diode is completed.

According to the third embodiment, as described above, the strain reducing layer 301 having the second thermal expansion coefficient T2 lower than the first thermal expansion coefficient T1 is formed on the substrate 300 having the first thermal expansion coefficient T1 and then the GaN thick film 303 having the third thermal expansion coefficient T3 lower than the first thermal expansion coefficient T1 and higher than the second thermal expansion coefficient T2 is formed on the strain reducing layer 301. Accordingly, when the temperature of the substrate 300 is lowered from a temperature for the crystal growth of the GaN thick film 303 to a room temperature after the formation of the GaN thick film 303, a compression strain applied from the substrate 300 to the strain reducing layer 301 and a tensile strain applied from the strain reducing layer 301 to the GaN thick film 303 cancel out each other. In other words, since the GaN thick film 303 having the third thermal expansion coefficient T3 is formed on a multilayer structure composed of the substrate 300 having the first thermal expansion coefficient T1 higher than the third thermal expansion coefficient T3 and the strain reducing layer 301 having the second thermal expansion coefficient T2 lower than the third thermal expansion coefficient T3, the difference between a mean value of the thermal expansion coefficients of the multilayer structure and the third thermal expansion coefficient T3 can be made smaller than the difference between the first and third thermal expansion coefficients T1 and T3. Consequently, the internal stress produced in the GaN thick film 303 in response to the compression strain from the substrate 300 is reduced and cracks are less likely to be formed in the GaN thick film 303. This improves the crystalline characteristics of the GaN thick film 303. By thus separating the GaN thick film 303 from the multilayer structure composed of the substrate 300 and the strain reducing layer 301, there can be formed the semiconductor substrate 304 composed of the GaN thick film 303 having excellent crystalline characteristics.

In the third embodiment, in particular, the compression strain applied from the substrate 300 to the GaN thick film 303 and the tensile strain applied from the strain reducing layer 301 to the GaN thick film 303 are balanced by adjusting the thickness of the substrate 300 made of sapphire to 300 μm and adjusting the thickness of the strain reducing layer 301 made of silicon to about 80 μm. This minimizes the strain applied from the multilayer structure composed of the substrate 300 and the strain reducing layer 301 to the GaN thick film 303 (see FIG. 2) and makes it possible to surely prevent the formation of cracks in the GaN thick film 303 and further improve the crystalline characteristics of the GaN thick film 303.

Since the third embodiment has formed the GaN thick film 303 on the substrate 300 having a large diameter of about 2 inches, there can be formed the semiconductor substrate 304 composed of the GaN thick film 303 having excellent crystalline characteristics and a large area.

Since the third embodiment has formed the strain reducing layer 301 made of silicon on the substrate 300 made of sapphire, the strain reducing layer 301 has a specified growth interface so that the crystalline characteristics of the GaN thick film 303 formed on the strain reducing layer 301 are further improved. By forming the substrate 300 made of sapphire and having a main surface having a (0001) plane, for example, the strain reducing layer 301 made of silicon and having a growth interface having a (111) plane is formed so that the GaN thick film 303 having a growth interface having a (0001) plane is formed on the strain reducing layer 301. This further improves the crystalline characteristics of the GaN thick film 303.

Specifically, the diameter of the semiconductor substrate 304 composed of the GaN thick film 303 was about 2 inches, which is nearly equal to the diameter of the substrate 300. As a result of observing a surface portion of the semiconductor substrate 304 by using an optical microscope, it was found that cracks were barely formed in the surface portion of the semiconductor substrate 304, i.e., in the surface portion of the GaN thick film 303.

Since the third embodiment has removed the strain reducing layer 301 by using a solution containing a hydrofluoric acid, the GaN thick film 303 can be separated from the multilayer structure composed of the substrate 300 and the strain reducing layer 301 without removing the substrate 300 by polishing. As a result, the semiconductor substrate 304 composed of the GaN thick film 303 can be formed easily in a short period of time and the substrate 300 separated from the GaN thick film 303 can be used again to newly form a GaN thick film.

In the third embodiment, if the ratio T1/T3 of the first thermal expansion coefficient T1 (substrate 300) to the third thermal expansion coefficient T3 (GaN thick film 303) is lower than the ratio T3/T2 of the third thermal expansion coefficient T3 to the second thermal expansion coefficient T2 (strain reducing layer 301), the strain reducing layer 301 is preferably formed to have a thickness smaller than the thickness of the substrate 300. Conversely, if the ratio T1/T3 of the first thermal expansion coefficient T1 to the thermal expansion coefficient T3 is higher than the ratio T3/T2 of the third thermal expansion coefficient T3 to the second thermal expansion coefficient T2, the strain reducing layer 301 is preferably formed to have a thickness larger than the thickness of the substrate 300. This further reduces the difference between a mean value of the thermal expansion coefficients of the multilayer structure composed of the substrate 300 and the strain reducing layer 301 and the third thermal expansion coefficient T3 and further improves the crystalline characteristics of the GaN thick film 303.

Specifically, since the GaN thick film 303 having a thermal expansion coefficient of $5.59 \times 10^{-6}$/K (third thermal expansion coefficient T3) is formed on the substrate 300 made of sapphire having a thermal expansion coefficient of $7.5 \times 10^{-6}$/K (first thermal expansion coefficient T1) with the strain reducing layer 301 made of silicon having a thermal expansion coefficient of $2.55 \times 10^{-6}$/K (second thermal expansion coefficient T2) interposed therebetween, the ratio T1/T3 (about 1.34) of the first thermal expansion coefficient T1 to the third thermal expansion coefficient T3 is lower than the ratio T3/T2 (about 2.19) of the third thermal expansion coefficient T3 to the second thermal expansion coefficient T2, so that the thickness of the strain reducing layer 301 is made smaller than the thickness of the substrate 300.

Although the third embodiment has used the substrate 300 made of sapphire, it is also possible to use instead a substrate made of ZnO (with a thermal expansion coefficient of $8.25 \times 10^{-6}$/K), GaAs (with a thermal expansion coefficient of $6.0 \times 10^{-6}$/K), MgO (with a thermal expansion coefficient of $10.5 \times 10^{-6}$/K), MgAlO$_2$ (with a thermal expansion coefficient of $7.45 \times 10^{-6}$/K), BeO (with a thermal expansion coefficient of $7.3 \times 10^{-6}$/K), or the like.

Although the third embodiment has used the strain reducing layer 301 made of silicon, it is also possible to use instead a strain reducing layer made of SiC (with a thermal expansion coefficient of $3.7 \times 10^{-6}$/K), InP (with a thermal expansion coefficient of $4.5 \times 10^{-6}$/K), diamond (with a thermal expansion coefficient of $2.3 \times 10^{-6}$/K), BP (with a thermal expansion coefficient of $3.0 \times 10^{-6}$/K), or the like.

Although the third embodiment has formed the AlN layer 302 as the buffer layer, the present invention is not limited thereto. It is also possible to form a layer made of a nitride compound represented by Al$_x$Ga$_{1-x}$N ($0 < x \leq 1$) as the buffer layer.

Although the third embodiment has formed the GaN thick film 303 on the strain reducing layer 301 with the buffer layer interposed therebetween, the present invention is not limited thereto. It is also possible to form a thick-film semiconductor layer made of a nitride compound represented by Al$_y$Ga$_{1-y-z}$In$_z$N ($0 \leq y \leq 1$, $0 \leq z \leq 1$) on the strain reducing layer 301 with the buffer layer interposed therebetween by supplying a gallium raw material, an aluminium raw material, and an indium raw material at an appropriate mixing ratio.

Although the third embodiment has formed the strain reducing layer 301 made of silicon on the substrate 300 made of sapphire by crystal growth, it is possible to bond a first substrate made of sapphire and having a specified thickness to a second substrate made of silicon and having a specified thickness. Alternatively, it is also possible to bond a first substrate made of sapphire to a second substrate made of silicon and then polish the first or second substrate to a specified thickness.

Although the third embodiment has removed the strain reducing layer 301 by using the solution containing a hydrofluoric acid and thereby separated the GaN thick film 303 from the multilayer structure composed of the substrate 300 and the strain reducing layer 301, it is also possible to remove the multilayer structure composed of the substrate 300 and the strain reducing layer 301 by polishing and thereby separate the GaN thick film 303 from the multilayer structure.

Although the third embodiment has left the AlN layer 302 at the back surface of the GaN thick film 303 composing the semiconductor substrate 304, it is also possible to remove the AlN layer 302.

Although the third embodiment has formed the first contact layer 305 made of n-type GaN on the semiconductor substrate 304, i.e., on the GaN thick film 303, it is also possible to form the first contact layer in the surface portion of the GaN thick film 303 by doping the surface portion of the Gan thick film 303 with an impurity such as Si, Ge, or Se.

Although the third embodiment has formed the laser diode on the semiconductor substrate 304, the present invention is not limited thereto. It is also possible to form another device comprising a nitride compound semiconductor layer such as a light-emitting diode or a high-speed transistor.

Variation of Embodiment 3

Figure 5A:
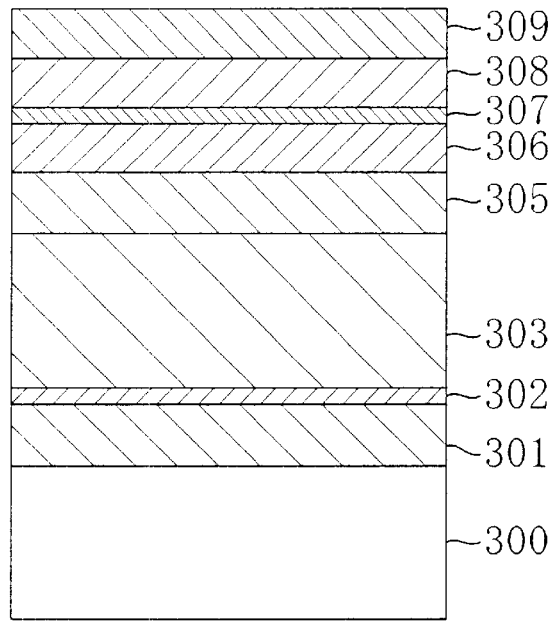
FIGS. 5 (a) and (b) are cross-sectional views illustrating the individual process steps of a method of fabricating a semiconductor device according to a variation of the third embodiment.
Figure 5B:
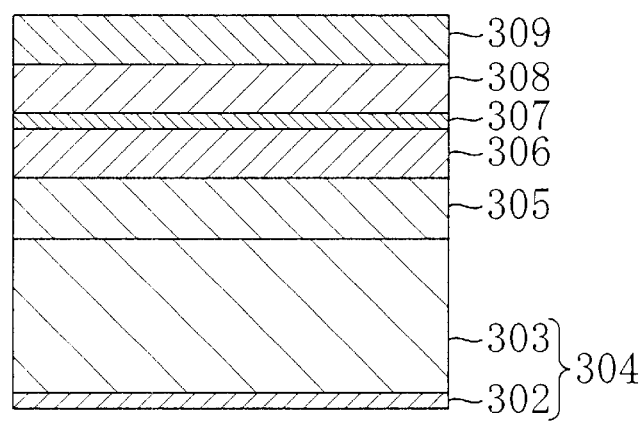
Figure 6:
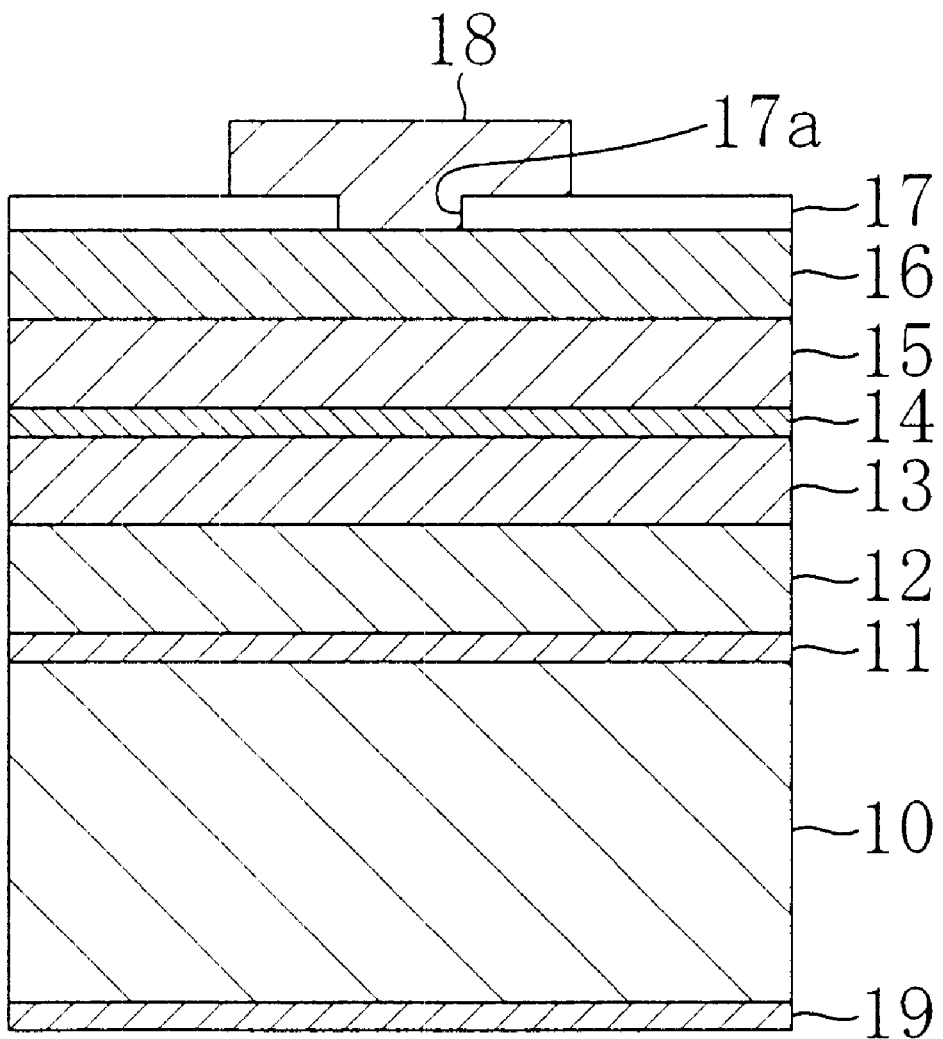
FIG. 6 is across-sectional view of a semiconductor device according to a first conventional embodiment.
Figure 7:
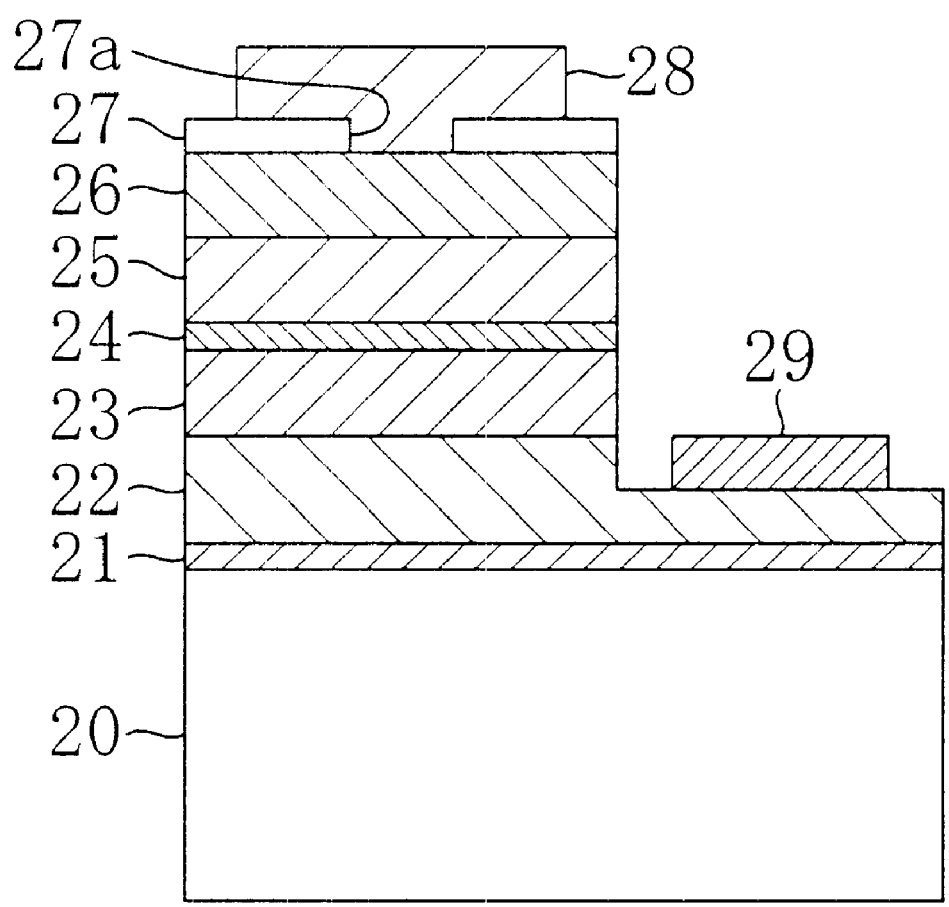
FIG. 7 is a cross-sectional view of a semiconductor device according to a second conventional embodiment.
Figure 8A:
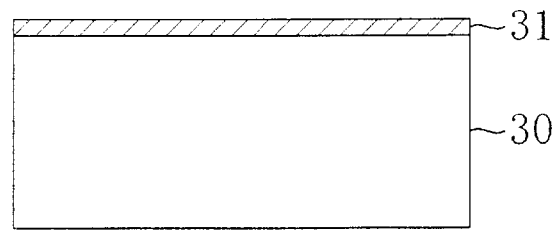
FIGS. 8(a) to (d) are cross-sectional views illustrating the individual process steps of a method of fabricating the semiconductor device according to a third conventional embodiment.
Figure 8B:
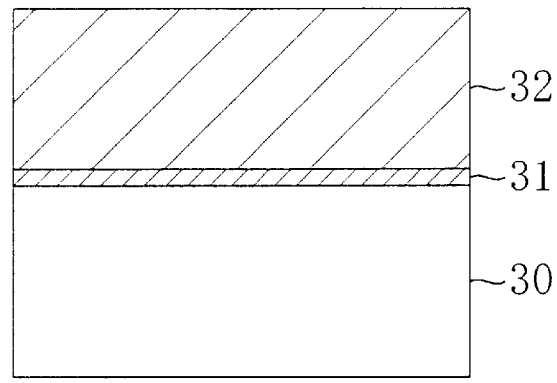
Figure 8C:
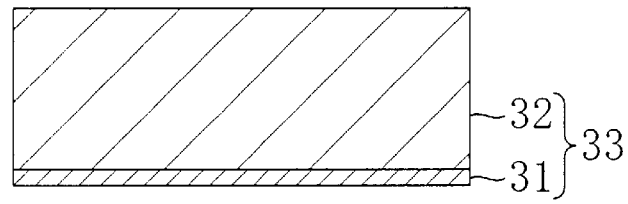
Figure 8D:
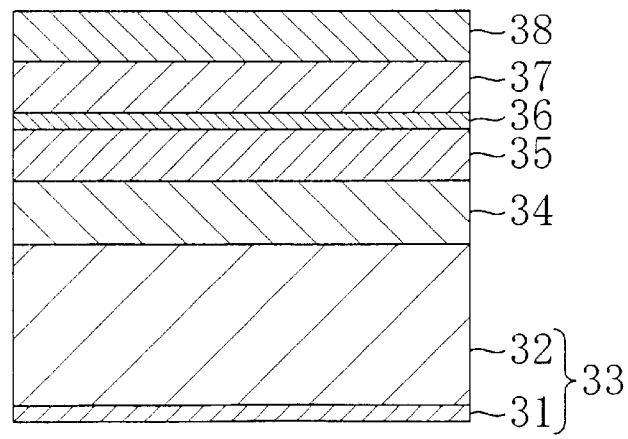

Referring to FIGS. 5(*a*) to (*d*), a description will be given to a semiconductor device and a method of fabricating the same according to a variation of the third embodiment of the present invention by using a laser diode as an example. In the variation of the third embodiment, the description of the same members used in the third embodiment and shown in FIGS. 4(*a*) to (*d*) will be omitted by retaining the same reference numerals.

A description will be given to the difference between the variation of the third embodiment and the third embodiment.

In the third embodiment, the strain reducing layer 301, the AlN layer 302, and the GaN thick film 303 are formed successively on the substrate 300, as shown in FIGS. 4(*a*) and (*b*). Subsequently, the GaN thick film 303 is separated from the multilayer structure composed of the substrate 300 and the strain reducing layer 301, as shown in FIG. 4(*c*). Thereafter, the device structure (the first contact layer 305, the first clad layer 306, the active layer 307, the second clad layer 308, and the second contact layer 309) is formed on the GaN thick film 303, i.e., on the semiconductor substrate 304, as shown in FIG. 4(*d*).

In the variation of the third embodiment, on the other hand, the strain reducing layer 301, the AlN layer 302, and the GaN thick film 303 are formed successively on the substrate 300, as shown in FIGS. 4(*a*) and (*b*), similarly to the third embodiment. Then, the same device structure as formed in the third embodiment is formed on the GaN thick film 303, as shown in FIG. 5(*a*). Thereafter, the GaN thick film 303, i.e., the semiconductor substrate 304 and the device structure formed thereon are separated from the multilayer structure composed of the substrate 300 and the strain reducing layer 301, as shown in FIG. 5(*b*).

Thus, the variation of the third embodiment achieves the same effect as achieved by the third embodiment, except that the timing of forming the device structure is different.

In the variation of the third embodiment also, it is preferable to remove the strain reducing layer 301, i.e., the silicon crystal layer by using the solution containing a hydrofluoric acid and thereby separate the GaN thick film 303 or the like from the multilayer structure composed of the substrate 300 and the strain reducing layer 301. This obviates the necessity to remove the substrate 300 by polishing. As a result, the GaN thick film 303 can be separated easily from the multilayer structure composed of the substrate 300 and the strain reducing layer 301 in a short period of time, while the substrate 300 separated from the GaN thick film 303 can be used again to newly form a GaN thick film.

What is claimed is:

1. A method of fabricating a semiconductor device, the method comprising the steps of:
    forming a strain reducing layer having a second thermal expansion coefficient T2 on a substrate having a first thermal expansion coefficient T1, said strain reducing thermal layer being made of silicon, InP, diamond or BP; and
    forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$),
    the second thermal expansion coefficient T2 being lower than the first thermal expansion coefficient T1,
    the third thermal expansion coefficient T3 being lower than the first thermal expansion coefficient T and higher than the second thermal expansion coefficient T2.

2. The method of claim 1, wherein the substrate is made of sapphire and the strain reducing layer is made of silicon.

3. The method of claim 2, wherein the step of forming the strain reducing layer includes the step of forming the strain reducing layer having a growth interface having a (111) plane on the substrate having a main surface having a (0001) plane.

4. A method of fabricating a semiconductor device, the method comprising the steps of:
    forming a strain reducing layer having a second thermal expansion coefficient T2 on a substrate having a first thermal expansion coefficient T1; and
    forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$),
    the second thermal expansion coefficient T2 being lower than the first thermal expansion coefficient T1,
    the third thermal expansion coefficient T3 being lower than the first thermal expansion coefficient T1 and higher than the second thermal expansion coefficient T2,
    wherein the step of forming the strain reducing layer includes the step of forming, when a ratio T1/T3 of the first thermal expansion coefficient T1 to the third thermal expansion coefficient T3 is lower than a ratio T3/T2 of the third thermal expansion coefficient T3 to the second thermal expansion coefficient T2, the strain reducing layer such that the strain reducing layer is smaller in thickness than the substrate and forming, when the ratio T1/T3 of the first thermal expansion coefficient T1 to the third thermal expansion coefficient T3 is higher than the ratio T3/T2 of the third thermal expansion coefficient T3 to the second thermal expansion coefficient T2, the strain reducing layer such that the strain reducing layer is larger in thickness than the substrate.

5. A method of fabricating a semiconductor device, the method comprising the steps of:
    forming a strain reducing layer having a second thermal expansion coefficient T2 on a substrate having a first thermal expansion coefficient T1, said strain reducing thermal layer being made of ZnO, GaAs, MgO, $MgAlO_2$ or BeO; and
    forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$),
    the second thermal expansion coefficient T2 being higher than the first thermal expansion coefficient T1,
    the third thermal expansion coefficient T3 being higher than the first thermal expansion coefficient T1 and lower than the second thermal expansion coefficient T2.

6. A method of fabricating a semiconductor device, the method comprising the steps of:
    forming a strain reducing layer having a second thermal expansion coefficient T2 on a substrate having a first thermal expansion coefficient T1; and
    forming a semiconductor layer having a third thermal expansion coefficient T3 on the strain reducing layer, the semiconductor layer being made of a nitride compound represented by $Al_yGa_{1-y-z}In_zN$ ($0 \leq y \leq 1$, $0 \leq z \leq 1$),
    the second thermal expansion coefficient T2 being higher than the first thermal expansion coefficient T1,
    the third thermal expansion coefficient T3 being higher than the first thermal expansion coefficient T1 and lower than the second thermal expansion coefficient T2,
    wherein the step of forming the strain reducing layer includes the step of forming, when a ratio T3/T1 of the third thermal expansion coefficient T3 to the first thermal expansion coefficient T1 is lower than a ratio T2/T3 of the second thermal expansion coefficient T2 to the third thermal expansion coefficient T3, the strain reducing layer such that the strain reducing layer is smaller in thickness than the substrate and forming, when the ratio T3/T1 of the third thermal expansion coefficient T3 to the first thermal expansion coefficient T1 is higher than the ratio T2/T3 of the second thermal expansion coefficient T2 to the third thermal expansion coefficient T3, the strain reducing layer such that the strain reducing layer is larger in thickness than the substrate.

7. A method of fabricating a semiconductor device, the method comprising the steps of:
    forming a strain reducing layer having a second thermal expansion coefficient T2 on a substrate having a first thermal expansion coefficient T1, said strain reducing layer being made of silicon, InP, diamond or BP;
    forming a semiconductor layer having a third thermal expansion coefficient T3 on the strain reducing layer, the semiconductor layer being made of a nitride compound represented by Al $Al_yGa_{1-y-z}In_zN$ ($0 \leq y \leq 1$, $0 \leq z \leq 1$); and
    separating the nitride compound semiconductor layer from a multilayer structure composed of the substrate and the strain reducing layer to form a semiconductor substrate composed of the nitride compound semiconductor layer, the second thermal expansion coefficient T2 being lower than the first thermal expansion coefficient T1, the third thermal expansion coefficient T3 being lower than the first thermal expansion coefficient T1 and higher than the second thermal expansion coefficient T2.

8. The method of claim 7, wherein the substrate is made of sapphire and the strain reducing layer is made of silicon.

9. The method of claim 8, wherein the step of forming the strain reducing layer includes the step of forming the strain reducing layer having a growth interface having a (111) plane on the substrate having a main surface having a (0001) plane.

10. The method of claim 8, wherein the step of forming the semiconductor substrate includes the step of removing the strain reducing layer by using a solution containing a hydrofluoric acid.

11. A method of fabricating a semiconductor device, the method comprising the steps of:

forming a strain reducing layer having a second thermal expansion coefficient T2 on a substrate having a first thermal expansion coefficient T1;

forming a semiconductor layer having a third thermal expansion coefficient T3 on the strain reducing layer the semiconductor layer being made of a nitride compound represented by Al $Al_yGa_{1-y-z}In_zN$ ($0 \leq y \leq 1$, $0 \leq z \leq 1$); and separating the nitride compound semiconductor layer from a multilayer structure composed of the substrate and the strain reducing layer to form a semiconductor substrate composed of the nitride compound semiconductor layer, the second thermal expansion coefficient T2 being lower than the first thermal expansion coefficient T1, the third thermal expansion coefficient T3 being lower than the first thermal expansion coefficient T1 and higher than the second thermal expansion coefficient T2, wherein the step of forming the strain reducing layer includes the step of forming, when ratio T1/T3 of the first thermal expansion coefficient T1 to the third thermal expansion coefficient T3 is lower than a ratio T3/T2 of the third thermal expansion coefficient T3 to the second thermal expansion coefficient T2, the strain reducing layer such that the strain reducing layer is smaller in thickness than the substrate and forming, when the ratio T1/T3 of the first thermal expansion coefficient T1 to the third thermal expansion coefficient T3 is higher than the ratio T3/T2 of the third thermal expansion coefficient T3 to the second thermal expansion coefficient T2, the strain reducing layer such that the strain reducing layer is larger in thickness than the substrate.

12. A method of fabricating a semiconductor device, the method comprising the steps of:

forming a strain reducing layer having a second thermal expansion coefficient T2 on a substrate having a first thermal expansion coefficient T1, said strain reducing layer being made of ZnO, GaAs, MgO, $MgAlO_2$ or BeO;

forming a semiconductor layer having a third thermal expansion coefficient T3 on the strain reducing layer, the semiconductor layer being made of a nitride compound represented by Al $Al_yGa_{1-y-z}In_zN$ ($0 \leq y \leq 1$, $0 \leq z \leq 1$); and separating the nitride compound semiconductor layer from a multilayer structure composed of the substrate and the strain reducing layer to form a semiconductor substrate composed of the nitride compound semiconductor layer, the second thermal expansion coefficient T2 being higher than the first thermal expansion coefficient T1, the third thermal expansion coefficient T3 being higher than the first thermal expansion coefficient T1 and lower than the second thermal expansion coefficient T2.

13. A method of fabricating a semiconductor device, the method comprising the steps of:

forming a strain reducing layer having a second thermal expansion coefficient T2 on a substrate having a first thermal expansion coefficient T1;

forming a semiconductor layer having a third thermal expansion coefficient T3 on the strain reducing layer, the semiconductor layer being made of a nitride compound represented by Al $Al_yGa_{1-y-z}In_zN$ ($0 \leq y \leq 1$, $0 \leq z \leq 1$); and separating the nitride compound semiconductor layer from a multilayer structure composed of the substrate and the strain reducing layer to form a semiconductor substrate composed of the nitride compound semiconductor layer, the second thermal expansion coefficient T2 being higher than the first thermal expansion coefficient T1, the third thermal expansion coefficient T3 being higher than the first thermal expansion coefficient T1 and lower than the second thermal expansion coefficient T2, wherein the step of forming the strain reducing layer includes the step of forming, when a ratio T3/T1 of the first thermal expansion coefficient T3 to the first thermal expansion coefficient T1 is lower than a ratio T2/T3 of the second thermal expansion coefficient T2 to the third thermal expansion coefficient T3, the strain reducing layer such that the strain reducing layer is smaller in thickness than the substrate and forming, when the ratio T3/T1 of the third thermal expansion coefficient T3 to the first thermal expansion coefficient T1 is higher than the ratio T2/T3 of the second thermal expansion coefficient T2 to the third thermal expansion coefficient T3, the strain reducing layer such that the strain reducing layer is larger in thickness than the substrate.

* * * * *